United States Patent
Akiyoshi (10) Patent No.: US 7,852,700 B2
(45) Date of Patent: Dec. 14, 2010

(54) MEMORY DEVICE

(75) Inventor: Hideo Akiyoshi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 36 days.

(21) Appl. No.: 12/323,114

(22) Filed: Nov. 25, 2008

(65) Prior Publication Data

US 2009/0135662 A1 May 28, 2009

(30) Foreign Application Priority Data

Nov. 28, 2007 (JP) ............................. 2007-307656

(51) Int. Cl.
*G11C 5/14* (2006.01)
(52) U.S. Cl. ...................................... 365/227; 365/154
(58) Field of Classification Search ................. 365/154, 365/227
See application file for complete search history.

(56) References Cited

U.S. PATENT DOCUMENTS

2006/0262628 A1 11/2006 Nii et al.
2008/0055967 A1* 3/2008 Houston et al. ............. 365/154

FOREIGN PATENT DOCUMENTS

JP 2002-042476 A 2/2002
JP 2007-004960 A 1/2007

OTHER PUBLICATIONS

S. Ohbayashi et al, "*A 65 nm SoC Embedded 6T-SRAM Design for Manufacturing with Read and Write Cell Stabilizing Circuits*", Jun. 15, 2006, Hyogo, Japan.

* cited by examiner

*Primary Examiner*—Huan Hoang
*Assistant Examiner*—Jason Lappas
(74) *Attorney, Agent, or Firm*—Arent Fox LLP (57) ABSTRACT

A memory device includes a power supply line, a memory cell, a memory cell power supply node provided between the memory cell and the power supply line, a first voltage generating circuit coupled to the memory cell power supply node for supplying the memory cell power supply node with a first potential lower than a potential of the power supply line for a first period corresponding to at least a part of a writing operation period, and a second voltage generating circuit that is coupled to the memory cell power supply node for supplying the memory cell power supply node with a second potential lower than the potential of the power supply line for a second period corresponding to at least a part of the writing operation period.

12 Claims, 12 Drawing Sheets

MEMORY DEVICE

CROSS-REFERENCE TO RELATED APPLICATIONS

This application is based upon and claims the benefit of priority from the prior Japanese Patent Application No. 2007-307656, filed on Nov. 28, 2007, the entire contents of which are incorporated herein by reference.

BACKGROUND

The present invention relates to a memory device. In connection with the miniaturization of semiconductor devices, the writing margin and the reading margin of Static Random Access Memory (SRAM) have recently diminished. Some methods to enhance the writing margin have been proposed.

Japanese Laid-open Patent Publication No. 2002-42476 discloses a static semiconductor memory. The static semiconductor memory is provided with a voltage supply circuit. An internal power source line is connected to a memory cell. An external power source line is connected to a power source node and external power source voltage is supplied to the power source node. An internal write-in signal of a H level is inputted to the voltage supply circuit at the time of write-in of data, voltage VCC-VTH is supplied to a memory cell by a N channel MOS transistor. Also, an internal write-in signal of a L level is inputted to the voltage supply circuit at the time of read-out of data, and voltage VCC is supplied to a memory cell by a P channel MOS transistor Japanese Laid-open Patent Publication No. 2007-4960 discloses a semiconductor storage device having a plurality of memory cells arranged in a matrix form, a plurality of cell power supply lines each of which is arranged in association with each of memory cell arrays (columns) and coupled to the memory cells of each corresponding array (column), a plurality of cell power supply lines each of which is arranged in association with each of the memory cell columns and supplies a first power supply voltage to the memory cells of each corresponding column, and a plurality of writing assist circuits each of which is arranged in association with each of the memory cell arrays (columns) and selectively interrupts at least the supply of the first power supply voltage to the corresponding power supply line according to a voltage of the bit lines of the corresponding array (column).

Figure 11:
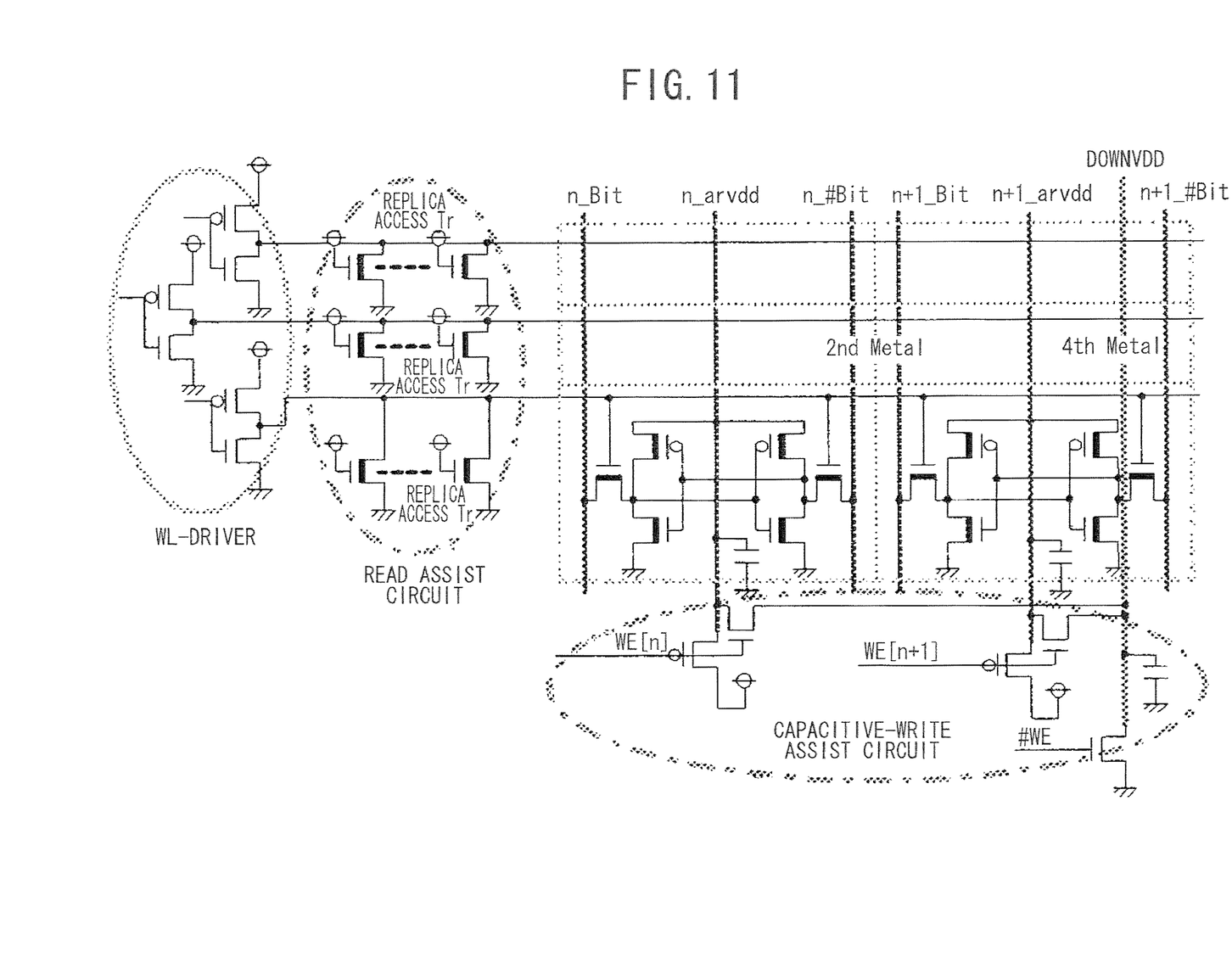
FIG. 11 is a circuit diagram showing a conventional static memory device.

A capacitive write-assist circuit (W-AC) technique described in FIG. 11 is disclosed in "A 65 nm SoC Embedded 6T-SRAM Design for Manufacturing with ReadandWrite Cell Stabilizing Circuits" reported in "2006 Symposium on VLSI Circuits".

Figure 12:
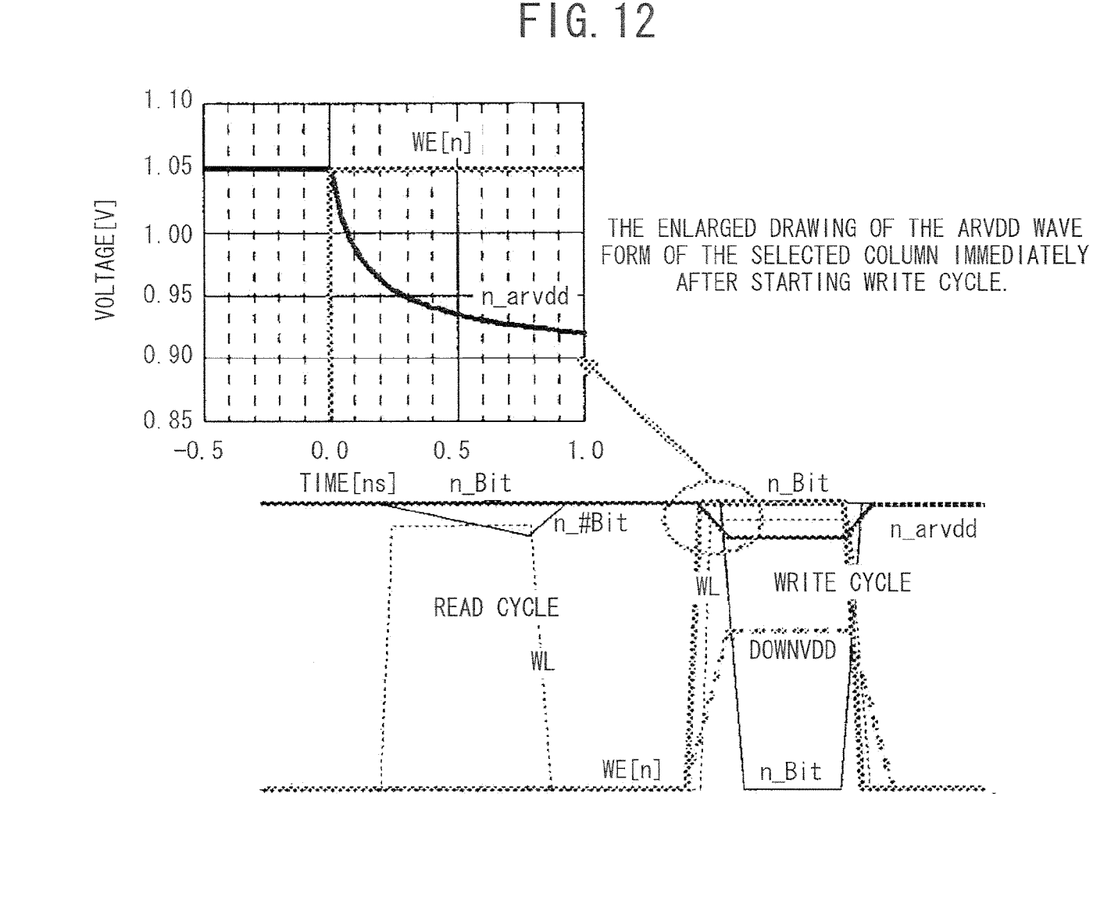
FIG. 12 is a flowchart showing aspects of the operation of the memory device of FIG. 11.

The arvdd formed by the 2nd metal layer exists in each column. The downvdd formed by 4th metal layer exists in each of 4 columns. FIG. 12 shows the waveform of read and write cycles. During the read cycle, arvdd=Vdd, and downvdd=GND. During the write cycle, both the arvdd of the selected column and the downvdd are put into a floating state and then the arvdd is shorted to the downvdd by the nMOS. So, the voltage level of arvdd falls in proportion to the capacity ratio between the arvdd node and the downvdd node. In the enlarged drawing of the arvdd waveform of the selected column immediately after starting the write cycle in FIG. 12, the arvdd falls down to 100 mV only 0.3 ns after starting the write cycle.

SUMMARY

Aspects of the invention include a memory device having a power supply line, a memory cell, a memory cell power supply node provided between the memory cell and the power supply line, a first voltage generating circuit coupled to the memory cell power supply node and supplying the memory cell power supply node with a first potential lower than a potential of the power supply line for a first period corresponding to at least a part of a writing operation period, and a second voltage generating circuit that is coupled to the memory cell power supply node and supplying the memory cell power supply node with a second potential lower than the potential of the power supply line for a second period corresponding to at least a part of the writing operation period.

PREFERRED EMBODIMENTS

Figure 7:
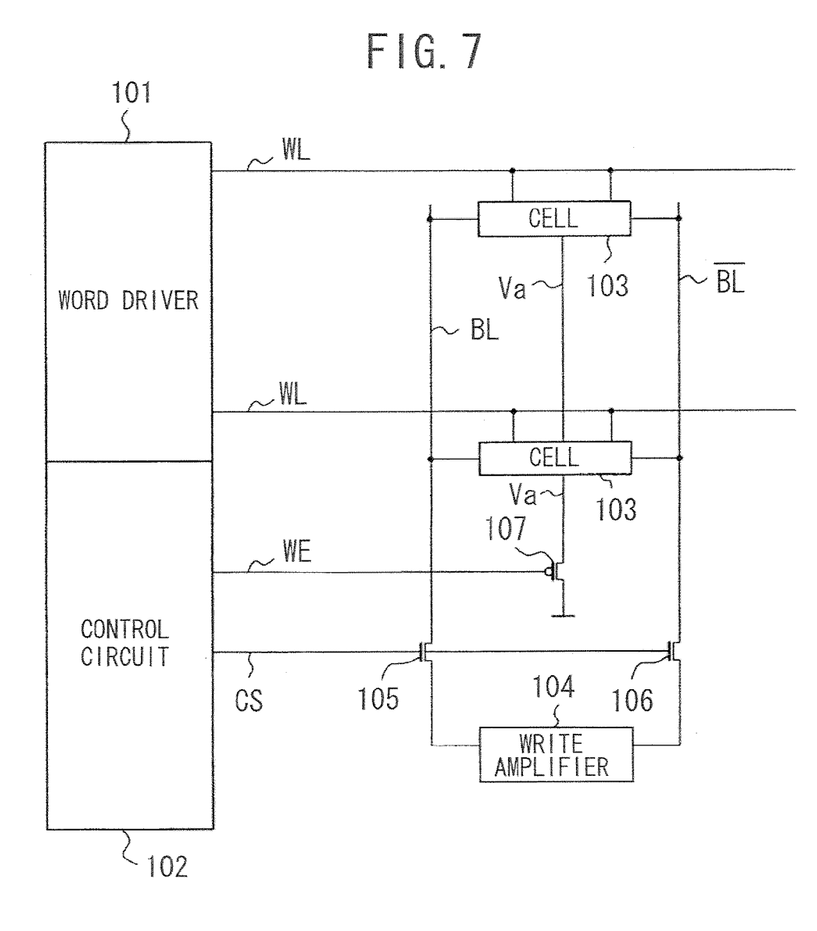
FIG. 7 is a circuit diagram showing aspects of a construction of the static memory device.
Figure 8:
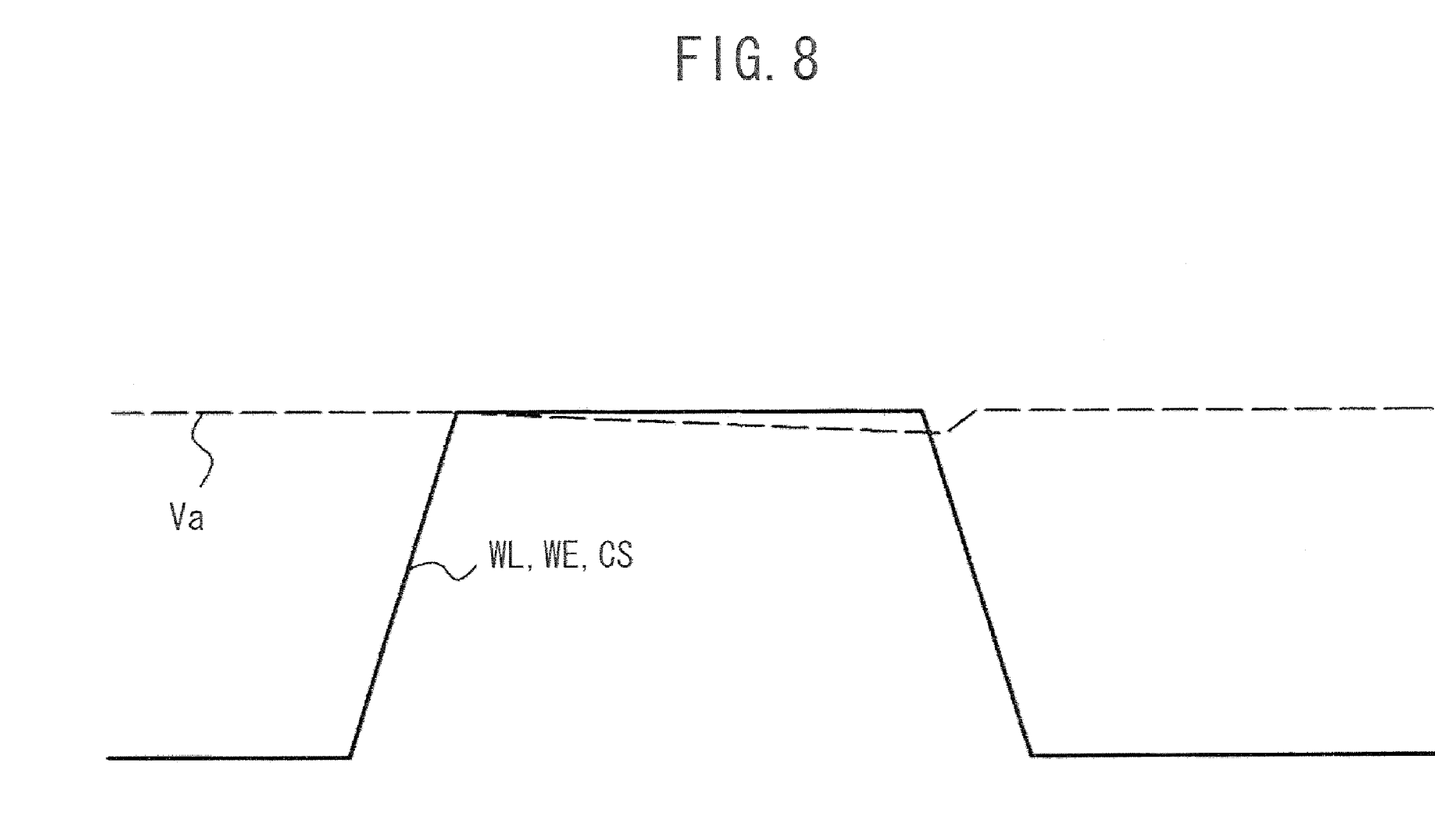
FIG. 8 is a flowchart showing aspects of the operation of the memory device of FIG. 7.

FIG. 7 is a circuit diagram showing an example of the construction of SRAM, and FIG. 8 is a flowchart showing the operation of the memory device of FIG. 7. A word driver 101 outputs a voltage to plural word lines WL. A control circuit 102 outputs a voltage to each of a write enable signal line WE and a column selecting line CS. Plural memory cells 103 are coupled to the plurality of word lines WL. Each memory cell 103 is coupled to bit lines BL and /BL. Here, Metal Oxide Semiconductor (MOS) electric field effect transistor will be hereunder merely referred to as "transistor". An n-channel transistor 105 has a gate, a drain and a source. The gate is coupled to the column selection line CS, the drain is coupled to the bit line BL and the source is coupled to a write amplifier 104. An n-channel transistor 106 has a gate coupled to the column selection line CS, a drain coupled to the bit line /BL, and a source coupled to the write amplifier 104. The write amplifier 104 outputs complementary data to the bit lines BL and /BL in the writing operation during which the potentials of the word line WL, the write enable signal line WE and the column selection line CS are set to the high level. That is, mutually inverted data is supplied to the bit lines BL and /BL. A p-channel transistor 107 has a gate coupled to the write enable signal line WE, a source coupled to a power supply voltage VDD and a drain coupled to a memory cell power supply node Va. The memory power supply node Va is coupled to the plurality of memory cells 103.

Figure 6:
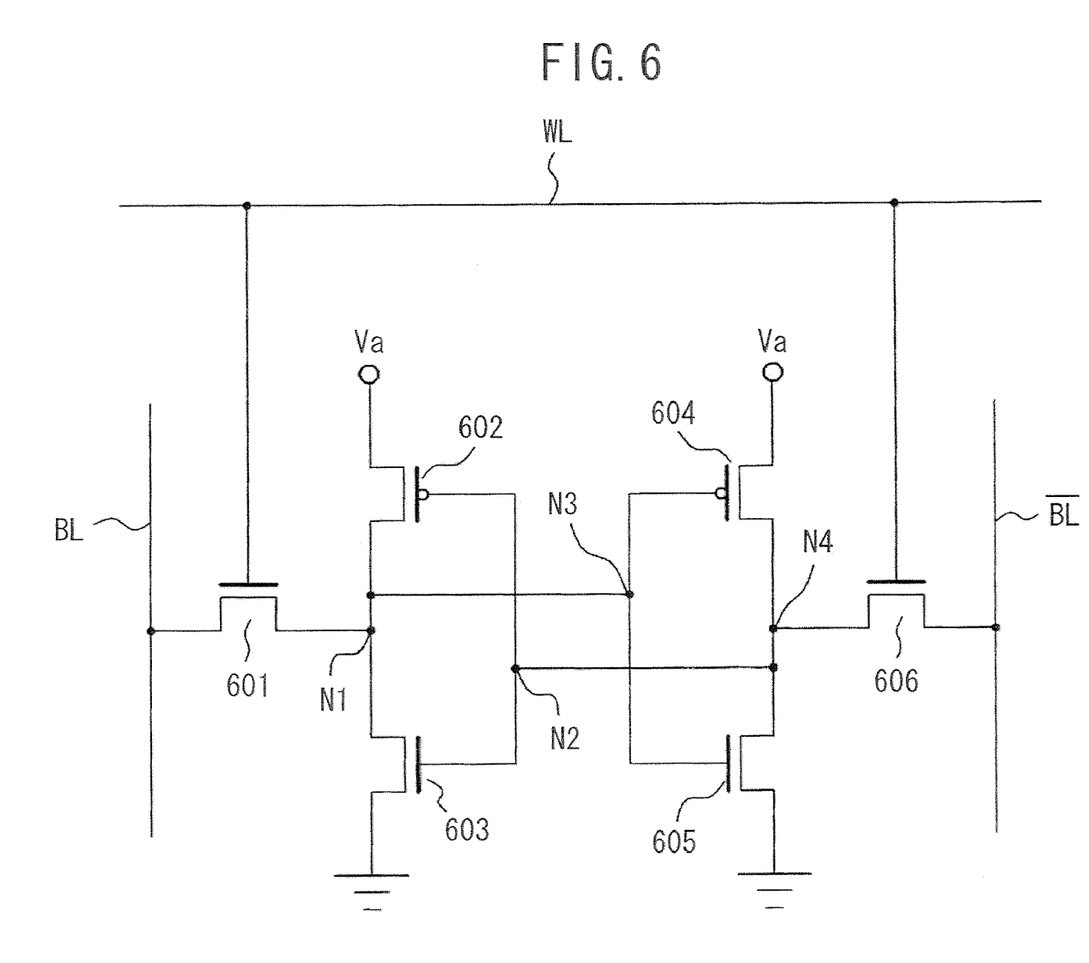
FIG. 6 is a circuit diagram showing aspects of an example of memory cells of FIG. 1.

FIG. 6 is a circuit diagram showing an example of the construction of the memory cell 103 of FIG. 7. An n-channel transistor 601 has a gate coupled to a word line WL, a drain coupled to a bit line BL and a source coupled to a node N1. A p-channel transistor 602 has a gate coupled to a node N2, a source coupled to a memory CELL power supply node Va and a drain coupled to a node N1. An n-channel transistor 603 has a gate coupled to a node N2, a drain coupled to the node N1 and a source coupled to a reference potential, for example, a ground potential. The node N1 is coupled to a node N3, and the node N2 is coupled to a node N4. The p-channel transistor 604 has a gate coupled to the node N3, a source coupled to the memory cell power supply node Va, and a drain coupled to the node N4. An n-channel transistor 605 has a gate coupled to the node N3, a drain coupled to the node N4, and a source coupled to the reference potential. An n-channel transistor 606 has a gate coupled to the word line WL, a drain coupled to the node N4, and a source coupled to a bit line /BL.

The transistors 602 and 603 constitute one inverter, and they invert the data at the node N2 or the node N4 and then output the inverted data to the node N1 or the node N3. The transistors 604 and 605 constitutes another inverter, and they invert the data at the node N3 or the node N1 and then output the inverted data to the node N4 or the node N2. These two inverters store a data.

When the potential of the word line WL is set to the high level, the transistors 601 and 606 are turned on, whereby the data of the bit lines BL and /BL can be written into the memory cell. When the potential of the bit line BL is set to the high level and the potential of the bit line /BL is set to the low level, data of the high level are stored in the nodes N1 and N3, and data of the low level are stored in the nodes N2 and N4. Conversely, when the potential of the bit line BL is set to the low level and the potential of the bit line /BL is set to the high level, data of the low level are stored in the nodes N1 and N3, and data of the high level are stored in the nodes N2 and N4.

A writing margin will be described. The description will be made on a case where the data of the node N1 is rewritten from the high level to the low level. First, the potential of the node N1 is set to the high level and the potential of the node N2 is set to the low level. The transistor 602 is turned on, and the transistor 603 is turned off. Thereafter, the potential of the bit line BL is set to the low level, and the potential of the word line WL is set to the high level. At this time, the transistor 601 is turned on. Furthermore, in a case where the ON-resistance of the transistor 601 is larger than the ON-resistance of the transistor 602, there occurs such an error that the potential of the node N1 is not lowered till the low level and thus the high level is kept even when the transistor 601 is turned on.

Furthermore, the error as described above is liable to occur due to the dispersion of the device characteristic which is caused by miniaturization of devices. In order to suppress the error as described above, it is desired to enhance the writing margin. In order to enhance the writing margin, the potential of the memory cell power supply node Va at the writing time is lowered. Accordingly, the potential of the node N1 is easily varied to the lower level when the potential of the node N1 is rewritten from the high level to the lower level.

As shown in FIG. 8, the potentials of the word line WL, the write enable signal line WE and the column selection line CS are set to low level before the writing operation. Since the potential of the word line WL is set to the low level, the transistors 601 and 606 are turned off, and the memory cell 103 is separated form the bit lines BL and /BL. Furthermore, the potential of the column selection line CS is set to the low level, and thus the transistors 105 and 106 are turned off, and the write amplifier 104 are separated from the bit line BL and /BL. Furthermore, since the potential of the write enable signal line WE is set to the low level, the transistor 107 is turned on, and the memory cell power supply node Va is coupled to the power supply voltage VDD. The memory cell 103 is supplied with the power supply voltage VDD from the memory cell power supply node Va.

Next, at the start time of the writing operation, the potentials of the word line WL, the write enable signal line WE and the column selection line CS are set to the high level. Since the potential of the column selection line CS is set to the high level, the transistors 105 and 106 are turned on, and the write amplifier 104 are coupled to the bit lines BL and /BL, and outputs complementary data to the bit lines BL and /BL. Furthermore, since the potential of the word line WL is set to the high level, the transistors 601 and 606 are turned on, and the memory cell 103 is coupled to the bit lines BL and /BL. The data of the bit line BL and /BL are written into the nodes N1 and N4. At this time, since the potential of the write enable signal line WE is set to the high level, the transistor 107 is turned off, and the memory cell power supply node Va is separated from the power supply voltage VDD and set to a floating state. By the writing operation and the leak current, the potential of the memory cell power supply node Va is gradually lowered. As described above, in the writing operation, the writing error is suppressed by lowering the potential of the memory cell power supply node Va.

Subsequently, when the writing operation is finished, the potentials of the word line WL, the write enable signal line WE and the column selection line CS are set to the low level, the transistor 107 is turned on, the memory cell power supply node Va is coupled to the power supply voltage VDD and the memory cell 103 is supplied with the power supply voltage VDD from the memory cell power supply node Va.

As described above, the memory cell power supply node Va is coupled to the power supply voltage VDD when the potential of the write enable signal line WE is set to the low level, however, it is separated from the power supply voltage VDD and set to the floating state when the potential of the write enable signal line WE is set to the high level. The potential of the memory cell power supply node Va is lowered through leakage of charges thereof through the load transistor 602 and the transfer transistor 601 of the memory cell 103 and the write amplifier 104. When the load transistor 602 and the transfer transistor 601 of the memory cell 103 are small in size, the decreasing speed of the potential of the memory cell power supply node Va is slow. Furthermore, the memory cell power supply node Va is set to the floating state, and thus for example when many memory cells 103 are coupled or when the operation condition of SRAM is a high-temperature condition, leak current is increased and the potential of the memory cell power supply node Va may be excessively reduced.

Figure 9:
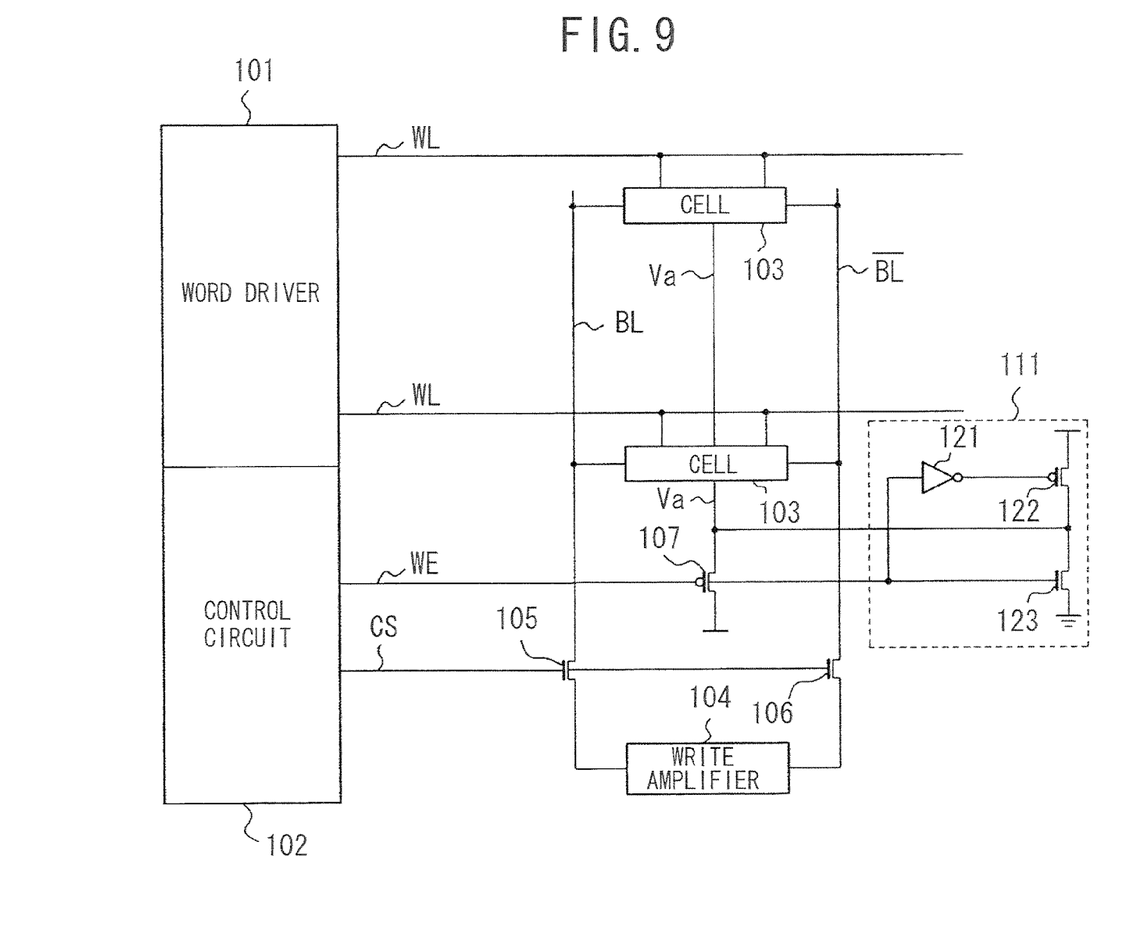
FIG. 9 is a circuit diagram showing aspects of another example of the static memory device.
Figure 10:
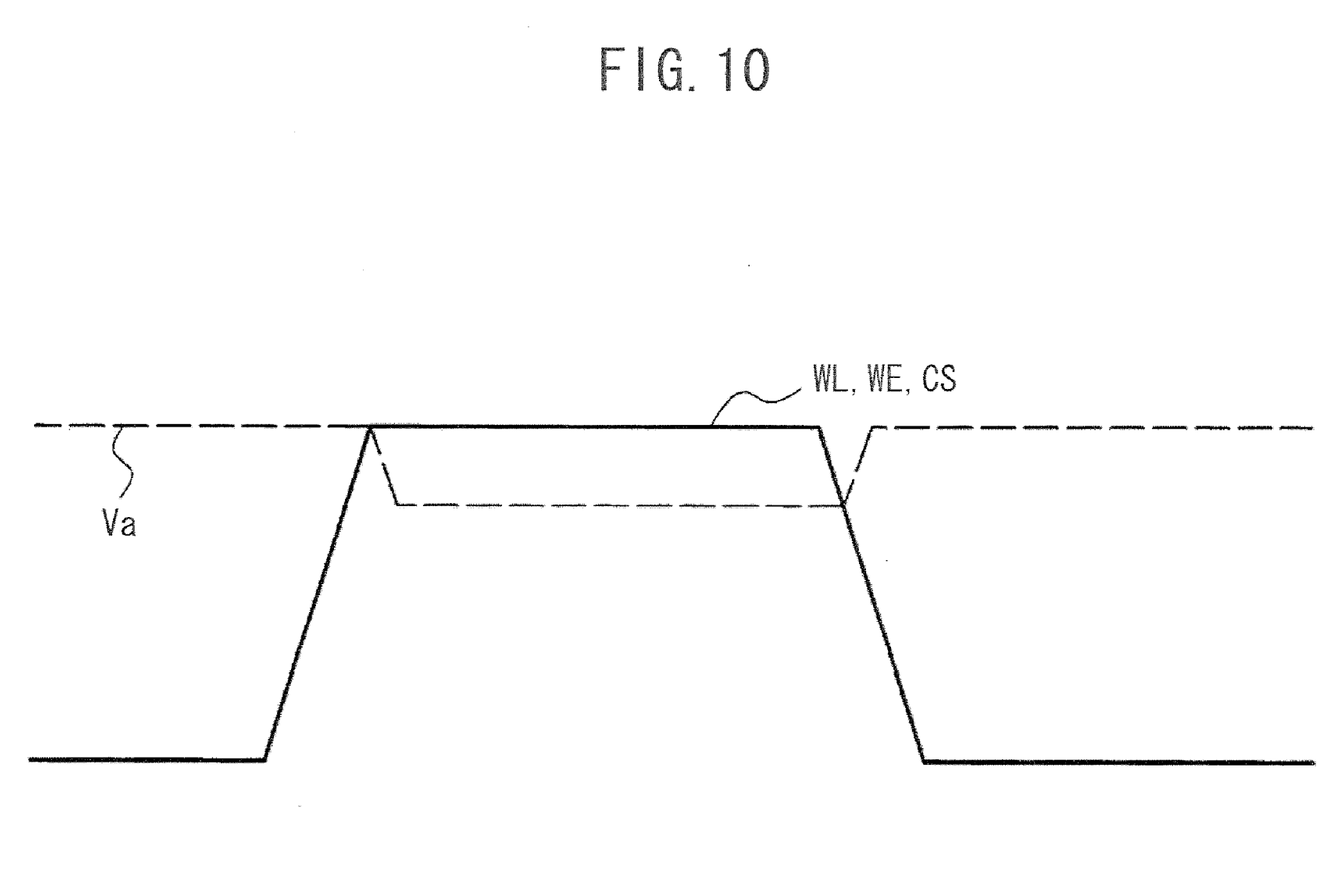
FIG. 10 is a flowchart showing aspects of the operation of the memory device of FIG. 9.

FIG. 9 is a circuit diagram showing another construction of a static memory device. FIG. 10 is a flowchart showing the operation of the memory device of FIG. 9. The memory device of FIG. 9 is constructed by adding the memory device of FIG. 7 with a memory power supply voltage generating circuit 111.

The memory cell power supply voltage generating circuit 111 has an inverter 121 and transistors 122 and 123. The inverter 121 inverts the signal of the write enable signal line WE and outputs the inverted signal from the output terminal thereof. The p-channel transistor 122 has a gate coupled to the output terminal of the inverter 121, a source coupled to the power supply voltage VDD and a drain coupled to the memory cell power supply node Va. The n-channel transistor 123 has a gate coupled to the write enable signal line WE, a drain coupled to the memory cell power supply node Va and a source coupled to the reference potential.

As shown in FIG. 10, before the writing operation, the potentials of the word line WL, the write enable signal line WE and the column selection line CS are set to the low level. Since the potential of the word line WL is set to the low level, the transistors 601 and 606 are turned off, and the memory cell 103 is separated from the bit lines BL and /BL. Furthermore, since the potential of the column selection line CS is set to the low level, the transistors 105 and 106 are turned off, and the write amplifier 104 are separated from the bit lines BL and /BL. Furthermore, since the potential of the write enable signal line WE is set to the low level, the transistor 107 is turned on, the transistors 122 and 123 are turned off, and the memory cell power supply node Va is coupled to the power supply voltage VDD. The memory cell 103 is supplied with the power supply voltage VDD from the memory cell power supply node Va.

At the start time of the writing operation, the potentials of the word line WL, the write enable signal line WE and the column selection line CS are set to the high level, the transistors 105 and 106 are turned on, and the write amplifier 104 is coupled to the bit lines BL and /BL and outputs complementary writing data to the bit lines BL and /BL. Furthermore, since the potential of the word line WL is set to the high level, the transistors 601 and 606 are turned on, and the memory cell 103 is coupled to the bit lines BL and /BL. The data of the bit lines BL and /BL are written into the node N1 and N4. At this time, since the potential of the write enable signal line WE is set to the high level, the transistor 107 is turned off, and the transistors 122 and 123 are turned on. Through-current flows in the transistors 122 and 123, and thus the potential of the memory cell power supply node Va is lower than the power supply voltage VDD. The memory cell power supply node Va is not under the floating state, and thus the potential thereof is fixed in the writing operation. As described above, the writing error can be suppressed by lowering the potential of the memory cell power supply node Va in the writing operation.

Subsequently, when the writing operation is finished, the potentials of the word line WL, the write enable signal line WE and the column selection line CS are set to the low level. Since the potential of the write enable signal line WE is set to the low level, the transistor 107 is turned on, and the transistors 122 and 123 are turned off. The memory cell power supply node Va is coupled to the power supply voltage VDD. The memory cell 103 is supplied with the power supply voltage VDD from the memory cell power supply node Va.

As described above, the memory cell power supply node Va is coupled to the power supply voltage VDD when the potential of the write enable signal line WE is set to the low level, however, it is separated from the power supply voltage VDD and coupled to the memory cell power supply voltage generating circuit 111 when the potential of the write enable signal line WE is set to the high level. In the memory cell power supply voltage generating circuit 111, when the potential of the write enable signal line WE is set to the high level, the transistors 122 and 123 are turned on and current flows therethrough, so that the memory cell power supply node Va is set to a predetermined potential by resistance division. The memory cell power supply node Va is not set to the floating state, and thus the potential of the memory cell power supply node Va is not excessively reduced even under a large leak current condition. In order to reduce the potential of the memory cell power supply node Va at high speed when the potential of the write enable signal line WE is shifted to the high level, it is necessary to increase the transistors 122 and 123 of the memory cell power supply voltage generating circuit 111, so that through-current flowing in the transistors 122 and 123 increases, and thus, the power consumption also increases.

Figure 1:
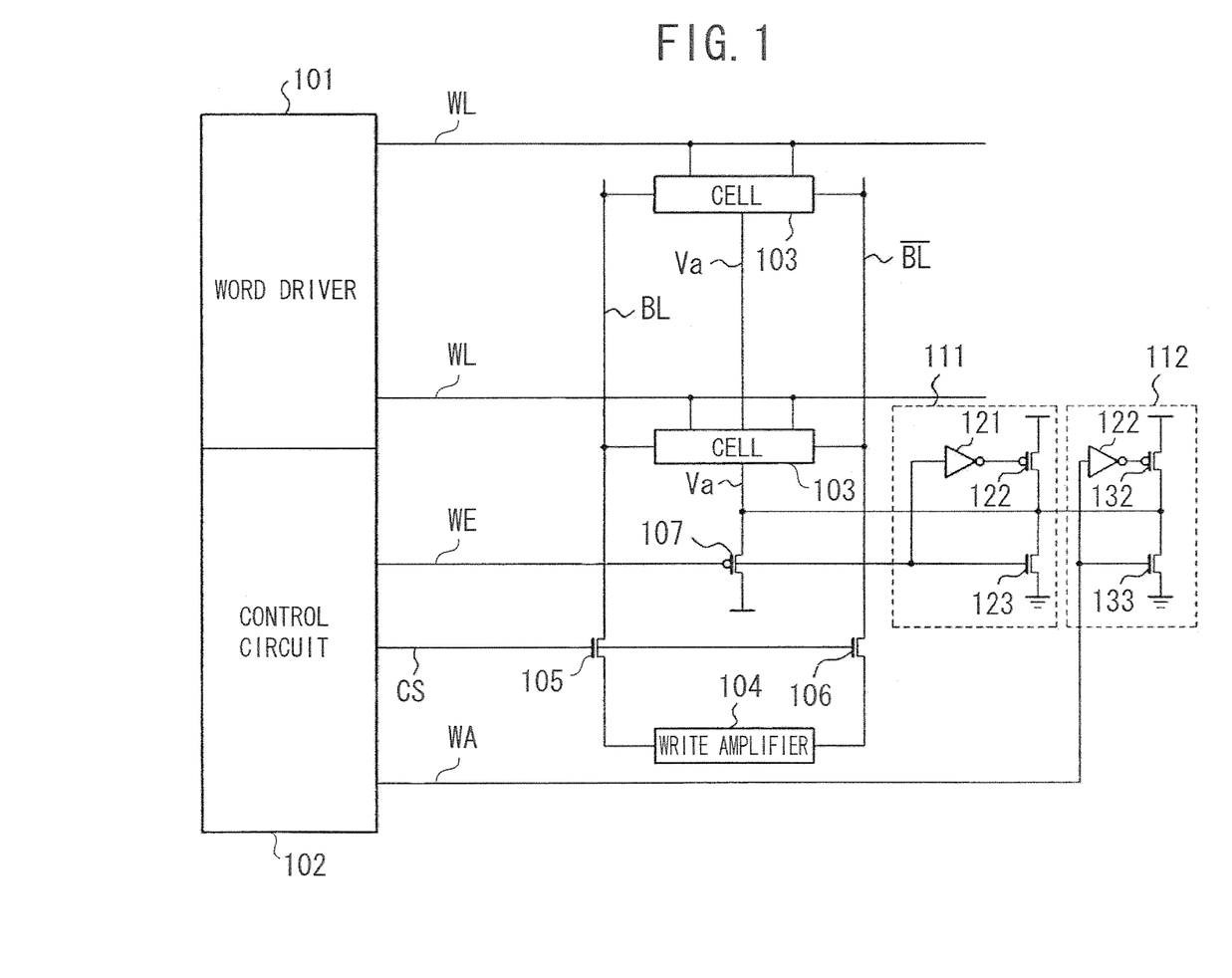
FIG. 1 is a circuit diagram showing a static memory device according to aspects of an embodiment of the present invention.
Figure 2:
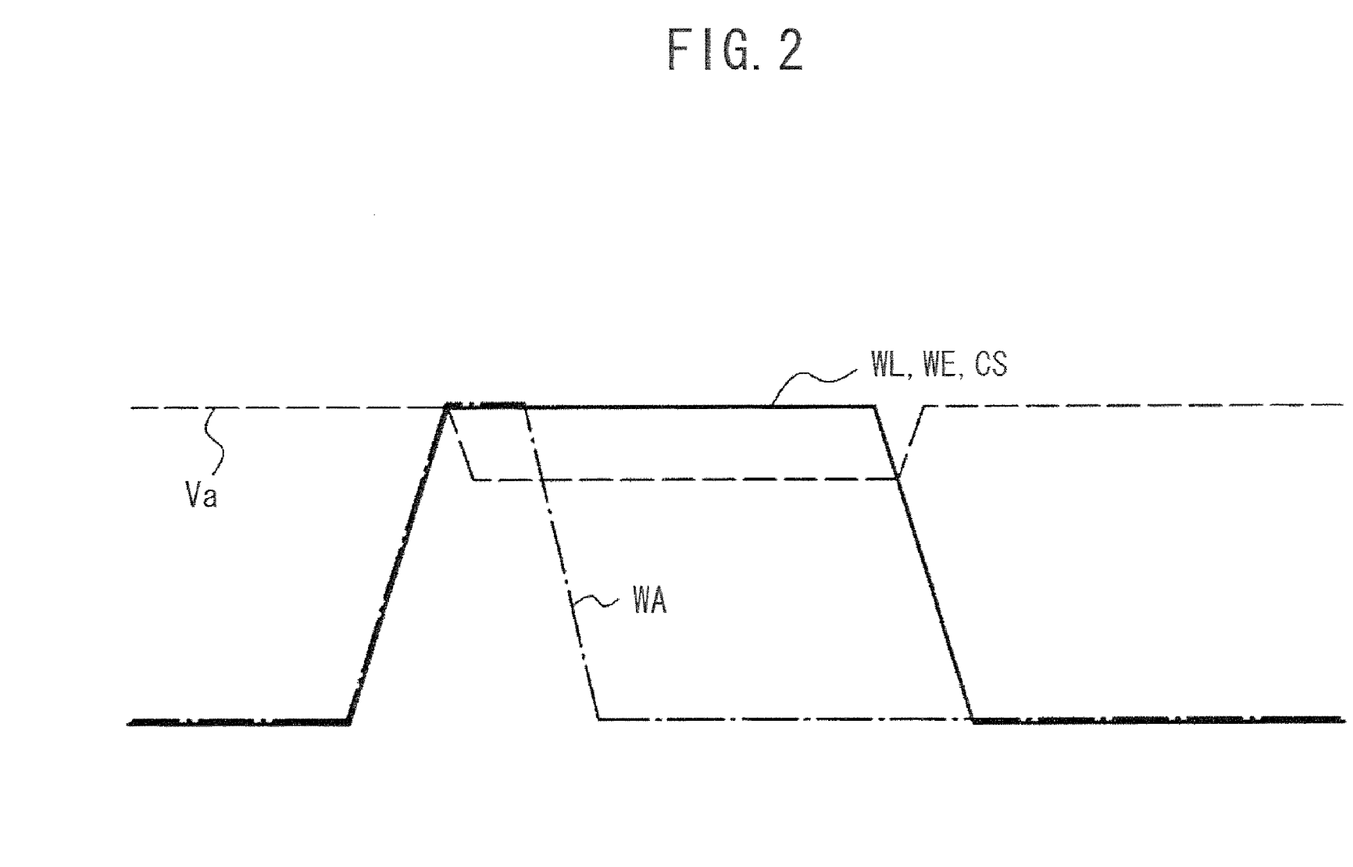
FIG. 2 is a flowchart showing aspects of the operation of the memory device of FIG. 1.

FIG. 1 is a circuit diagram showing aspects of an example of the construction of the static memory device according to an embodiment of the present invention, and FIG. 2 is a flowchart showing the operation of the memory device of FIG. 1. The memory device of FIG. 1 is obtained by adding the memory device of the memory device of FIG. 7 with a first memory cell power supply voltage generating circuit 111 and a second memory cell power supply voltage generating circuit 112.

Figure 5:
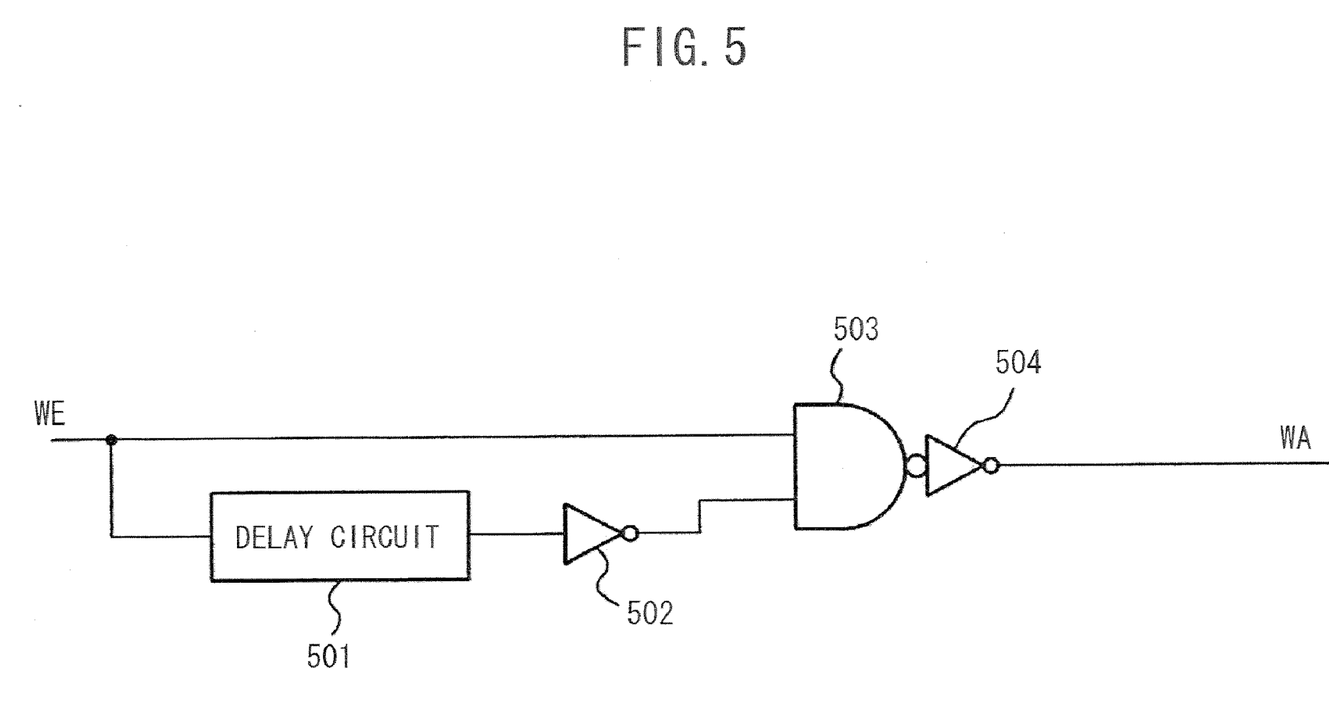
FIG. 5 is a circuit diagram showing aspects of an example of a signal generating circuit in a control circuit of FIG. 1.

A control circuit 102 has a signal generating circuit of FIG. 5, and generates a signal of the signal line WA on the basis of the signal of the write enable signal line WE. FIG. 5 is a circuit diagram showing an example of the construction of the signal generating circuit in the control circuit 102 of FIG. 1. A delay circuit 501 outputs a signal obtained by delaying the signal of the write enable signal line WE. An inverter 502 outputs a signal obtained by inverting the output signal of the delay circuit 501. A NAND circuit 503 receives the signal of the write enable signal line WE and the output signal of the inverter 502. The inverter 504 outputs to the signal line WA a signal obtained by inverting the output signal of NAND 503. As shown in FIG. 2, the signal of the signal line WA has the same rising timing as the signal of the write enable signal line WE and is a pulse signal having a shorter pulse width than the signal of the write enable signal line WE.

A first memory cell power supply voltage generating circuit 111 has an inverter 121 and transistors 122 and 123. The inverter 121 inverts the signal of the write enable signal line WE and outputs the inverted signal from the output terminal. The p-channel transistor 122 has a gate coupled to the output terminal of the inverter 121, a source coupled to the power supply voltage VDD and a drain coupled to the memory cell power supply node Va. The n-channel transistor 123 has a gate coupled to the write enable signal line WE, a drain coupled to the memory cell power supply node Va and a source coupled to the reference potential. The transistors 122 and 123 are transistors for lowering and holding the potential of the memory cell power supply node Va in the writing operation, and are smaller in size than the transistors 132 and 133. Smaller current flows in the transistors 122 and 123 as compared with the transistors 132 and 133.

A second memory cell power supply voltage generating circuit 112 has an inverter 131 and transistors 132 and 133. The inverter 131 inverts the signal of the signal line WA and outputs the inverted signal from the output terminal. The p-channel transistor 132 has a gate coupled to the output terminal of the inverter 131, a source coupled to the power supply voltage VDD and a drain coupled to the memory cell power node Va. The n-channel transistor 133 has a gate coupled to the signal line WA, a drain coupled to the memory cell power supply node Va and a source coupled to the reference potential. The transistors 132 and 133 are transistors for lowering the potential of the memory cell power supply node Va at high speed at the start time of the writing operation.

As shown in FIG. 2, before the writing operation, the potentials of the word line WL, the write enable signal line WE, the column selection line CS and the signal line WA are set to the low level. Since the potential of the word line WL is set to the low level, the transistors 601 and 606 are turned off, and the memory cell 103 is separated from the bit lines BL and /BL. Furthermore, since the potential of the column selection line CS is set to the low level, the transistors 105 and 106 are turned off, and the write amplifier 104 is separated from the bit lines BL and /BL. Since the potentials of the signal line WE and the WA are set to the low level, the transistor 107 is turned on, the transistors 122, 123, 132 and 133 are turned off, and the memory cell power supply node Va is coupled to the power supply voltage VDD. The memory cell 103 is supplied with the power supply voltage VDD from the memory cell power supply node Va.

At the start time of the writing operation, the potentials of the word line WL, the write enable signal line WE, the column selection CS and the signal line WA are set to the high level. Since the potential of the column selection line CS is set to the high level, the transistors 105 and 106 are turned on, and the write amplifier 104 is coupled to the bit line BL and /BL and outputs complementary writing data to the bit lines BL and /BL. Furthermore, since the word line WL is set to the high level, the transistors 601 and 606 are turned on, and the memory cell 103 is coupled to the bit line BL and /BL. The data of the bit lines BL and /BL are written into the nodes N1 and N4. At this time, since the potentials of the signal line WE and WA are set to the high level, the transistor 107 is turned off, and the transistors 122, 123, 132 and 133 are turned on. Through-current flows through the transistors 122, 123, 132 and 133. The potential of the memory cell power supply node Va is set to be lower than the power supply voltage VDD. At this time, current flows into the transistors 132 and 133 of the second memory cell power supply voltage generating circuit 112, and current also flows into the transistors 122 and 123 of the first memory cell power supply voltage generating circuit 111, so that the potential of the memory cell power supply node Va can be quickly lowered.

Subsequently, the potential of the signal line WA is set to the low level, and the potential of the signal line WE is kept high. When the potential of the signal line WA is set to the low level, the transistors 132 and 133 are turned off. Since the potential of the signal line WE is set to the high level, the transistors 122 and 123 keep the ON-state. Accordingly, the potential of the memory cell power supply node Va keeps the potential based on the resistance division of the transistors 122 and 123, thereby preventing the potential of the memory cell power supply node Va from being excessively lowered. At this time, the transistor of the second memory cell power supply voltage generating circuit 112 is turned off, and the transistors 122 and 123 of the first memory cell power supply voltage generating circuit 111 are smaller in size than the transistors 132 and 133, so that the power consumption in the writing operation can be reduced. Furthermore, the memory cell power supply node Va is not set to the floating state, and thus the potential in the writing operation is fixed. As described above, the writing error can be suppressed by lowering the potential of the memory cell power supply node Va in the writing operation.

Subsequently, in the writing operation, the potentials of the word line WL, the write enable signal line WE, the column selection line CS and the signal line WA are set to the low level. Since the potentials of the signal lines WE and WA are set to the low level, the transistor 107 is turned on, and the transistors 122, 123, 132 and 133 are turned off. The memory cell power supply node Va is coupled to the power supply voltage VDD. The memory cell 103 is supplied with the power supply voltage VDD from the memory cell power supply node Va.

The signal of the signal line WA is a narrower pulse in width than the signal of the signal line WE, and it is generated in the signal generating circuit of FIG. 5. The memory cell power supply node Va is coupled to the power supply voltage VDD when the potential of the write enable signal line WE is set to the low level, however, it is separated from the power supply voltage VDD and coupled to the first memory cell power supply voltage generating circuit 111 and the second memory cell power supply voltage generating circuit 112 when the potential of the write enable signal line WE is set to the high level. In the second memory cell power supply voltage generating circuit 112, when the potential of the signal WA is set to the high level, the transistors 132 and 133 are turned on and the potential of the memory cell power supply node Va is set to a predetermined potential. In the first memory cell power supply voltage generating circuit 111, when the potential of the write enable signal line WE is set to the high level, the transistors 122 and 123 are turned on, and through-current flows therethrough, whereby the potential of the memory cell power supply node Va is determined by the resistance division. The transistors 132 and 133 of the second memory cell power supply voltage generating circuit 112 are larger in size than the transistors 122 and 123. Therefore, the through-current of the first memory cell power supply voltage generating circuit 111 is smaller than the through-current of the second memory cell power supply voltage generating circuit 112. The time during which the potential of the signal line WA is lower than the high level is shorter than the time during which the potential of the write enable signal line WE is lower than the high level after the potential of the write enable signal line WE is changed from the low level to the high level. Therefore, the power consumption can be reduced as compared with the memory device of FIG. 9.

Figure 3:
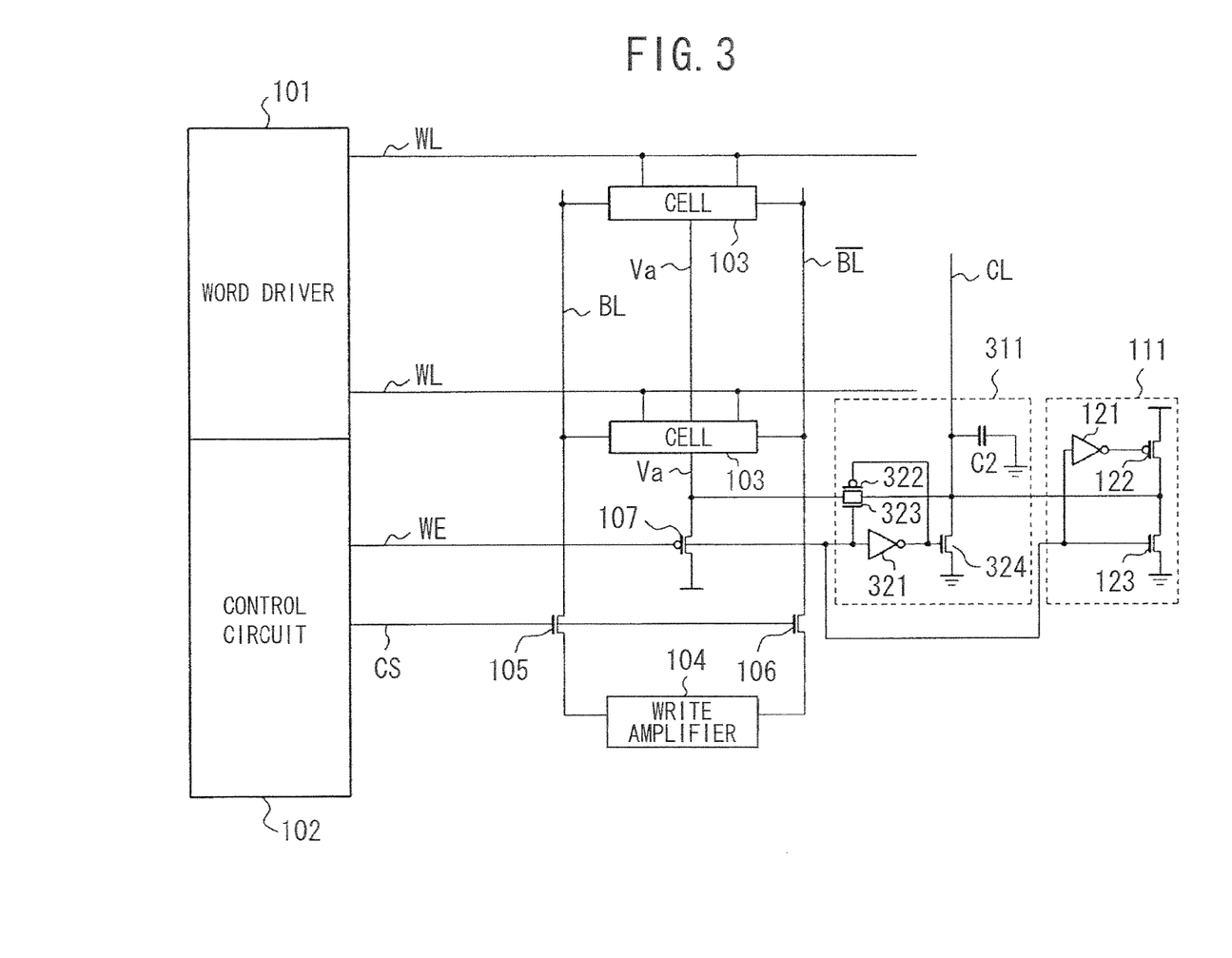
FIG. 3 is a circuit diagram showing a static memory device according to aspects of another embodiment of the present invention.
Figure 4:
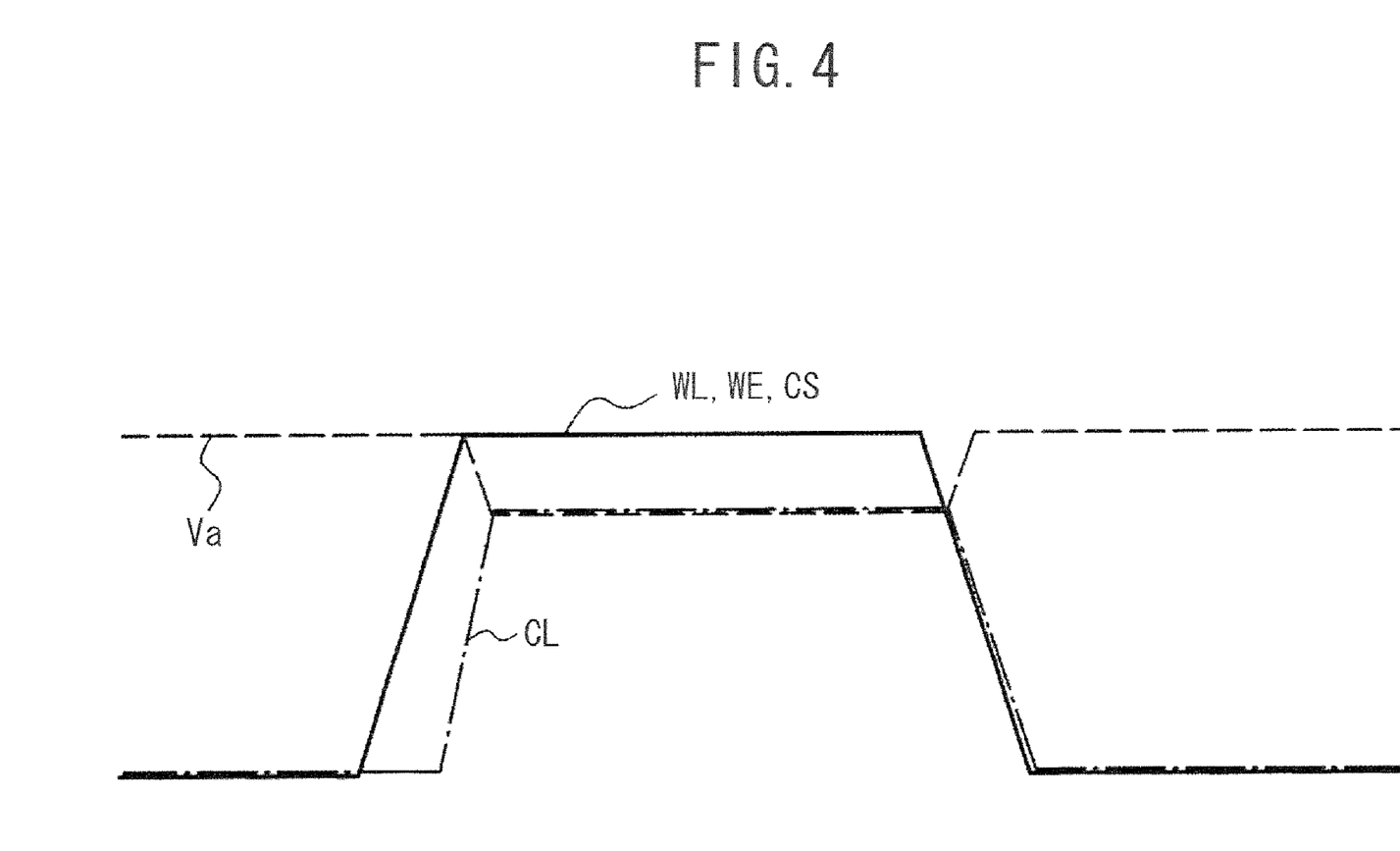
FIG. 4 is a flowchart showing aspects of the operation of the memory device of FIG. 3.

FIG. 3 is a circuit diagram showing an example of the construction of a static memory device according to another embodiment incorporating aspects of the present invention, and FIG. 4 is a flowchart showing the operation of the memory device of FIG. 3. The memory device of FIG. 3 is obtained by adding the memory device of FIG. 7 with a first memory cell power supply voltage generating circuit 111 and a second memory cell power supply voltage generating circuit 311.

The first memory cell power supply voltage generating circuit 111 has an inverter 121 and transistors 122 and 123. The inverter 121 inverts the signal of the write enable signal line WE and outputs the inverted signal from an output terminal. The p-channel transistor 122 has a gate coupled to the output terminal of the inverter 121, a source coupled to the power supply voltage VDD and a drain coupled to a capacitance line CL. The n-channel transistor 123 has a gate coupled to the write enable signal line WE, a drain coupled to the capacitance line CL and a source coupled to the reference potential. The transistors 122 and 123 lower and hold the potential of the memory cell power supply node Va during the writing operation.

A second memory cell power supply voltage generating circuit 311 has an inverter 321 and transistors 322, 323 and 324, a capacitor C2 and a capacitance line CL. The inverter 321 inverts the signal of the write enable signal line WE and outputs the inverted signal from the output terminal. The p-channel transistor 322 has a gate coupled to the output terminal of the inverter 321, a source coupled to the memory cell power supply node Va and a drain coupled to the capacitance line CL. The n-channel transistor 323 has a gate coupled to the write enable signal line WE, a drain coupled to the memory cell power supply node Va and a source coupled to the capacitance line CL. The transistors 322 and 423 constitute a transfer gate, and function as a switch between the memory cell power supply node Va and the capacitance line CL. The n-channel transistor 324 has a gate coupled to the output terminal of the inverter 321, a drain coupled to the capacitance line CL and a source coupled to the reference potential. The capacitor C2 is coupled between the capacitance line CL and the reference potential.

As shown in FIG. 4, before the writing operation, the potentials of the word line WL, the write enable signal line WE and the column selection line CS are set to the low level. Since the word line WL is set to the low level, the transistors 601 and 606 are turned off, and the memory cell 103 is separated from the bit lines BL and /BL. Furthermore, since the column selection line CS is set to the low level, the transistors 105 and 106 are turned off, and the write amplifier 104 is separated from the bit lines BL and /BL. Since the write enable signal line WE is set to the low level, the transistor 107 is turned on, and the memory cell power supply node Va is coupled to the power supply voltage VDD and set to the power supply voltage VDD. The memory cell 103 is supplied with the power supply voltage VDD from the memory cell power supply node Va and stores data. Since the potential of the write enable signal line WE is set to the low level, the transistors 122, 123, 322 and 323 are turned off, and the transistor 324 is turned on, so that the capacitance line CL is set to the reference potential.

Subsequently, at the start time of the writing operation, the potentials of the word line WL, the write enable signal line WE and the column selection line CS are set to the high level. Since the potential of the column selection line CS is set to the high level, the transistors 105 and 106 are turned on, and the write amplifier 104 is coupled to the bit lines BL and /BL, and outputs complementary writing data to the bit lines BL and /BL. Furthermore, since the potential of the word line WL is set to the high level, the transistors 601 and 606 are turned on, and the memory cell 103 is coupled to the bit lines BL and /BL. The data of the bit lines BL and /BL are written into the nodes N1 and N4. At this time, since the potential of the write enable signal line WE is set to the high level, the transistor 107 is turned off, and the memory cell power supply node Va is separated from the power supply voltage VDD, and set to the floating state. Furthermore, since the potential of the write enable signal line WE is set to the high level, the transistors 322 and 323 are turned on, and the transistor 324 is turned off. Since the memory cell power supply node Va is coupled to the capacitance line CL, it is lowered from the power supply voltage VDD, the capacitance line CL is increased from the reference potential, and the memory cell power supply node Va and the capacitance line CL are set to the same potential. The potential of the memory cell power supply node Va and the capacitance line CL is determined by the capacitance division of the capacitors C1 and C2.

Since the write enable signal line WE is set to the high level, the transistors 122 and 123 are turned on, so that the potential of the memory cell power supply node Va is kept to the potential based on the resistance division of the transistors 122 and 123. Furthermore, the memory cell power supply node Va is not set to the floating state, and thus the potential thereof is fixed in the writing operation, whereby the potentials of the memory cell power supply node Va and the capacitance line CL can be prevented from being excessively lowered. As described above, the writing error can be suppressed by lowering the potential of the memory cell power supply node Va in the writing operation.

Subsequently, when the writing operation is finished, the potentials of the word line WL, the write enable signal line WE and the column selection line CS are set to the low level. Since the write enable signal line WE is set to the low level, the transistor 107 is turned on, the transistors 122, 123, 322 and 323 are turned off, and the transistor 324 is turned on. The memory cell power supply node Va is coupled to the power supply voltage VDD, and the capacitance line CL is separated from the memory cell power supply node Va and coupled to the reference potential. The memory cell 103 is supplied with the power supply voltage VDD from the memory cell power supply node Va.

As described above, in the memory device of this embodiment, the potential of the memory cell power source node Va can be prevented from being lowered due to the leak current in the writing operation.

The memory device of this embodiment described above lowers the potential of the memory cell power supply node Va at the start time of the writing operation, and subsequently keeps the potential of the memory cell power supply node Va by making only the current for compensating for the leak current flow therethrough. As described above, the memory cell power supply voltage generating circuit for lowering the potential of the memory cell power supply node Va and the memory cell power supply voltage generating circuit for subsequently keeping the potential of the memory cell power supply node Va are provided separately from each other.

The memory device of the embodiment of the invention has the memory cell 103 for storing data, the memory cell power supply node Va for supplying the power supply voltage to the memory cell 103, the first memory cell power supply voltage generating circuit 111 which is coupled to the memory cell power supply node Va and lowers the potential of the memory cell power supply node Va in the writing operation, and the second memory cell power supply voltage generating circuit 112 or 311 which is coupled to the memory cell power supply node Va and lowers the potential of the memory cell power supply node Va in the writing operation.

The memory device has the word line WL which is coupled to the memory cell 103 and selects the memory cell 103, the bit lines BL and/or /BL which are coupled to the memory cell 103 and supply writing data into the memory cell 103, and the write amplifier 104 for outputting the writing data to the bit line BL. The memory cell 103 has plural inverter loop circuits. In FIG. 6, the memory cell 103 has a loop circuit of an inverter having transistors 602 and 603 and an inverter having transistors 604 and 605.

The memory device further has a first switch 107 for connecting the terminal of the power supply voltage VDD to the memory cell power supply node Va in the writing operation and separating the memory cell power supply node Va from the terminal of the power supply voltage VDD before and after the writing operation.

In the memory device of FIG. 1, the first and second memory cell power supply voltage generating circuits 111 and 112 lower the potential of the memory cell power supply node Va at different timings within the writing operation time.

Specifically, in the memory device of FIG. 1, the first memory cell power supply voltage generating circuit 111 lowers the potential of the memory cell power supply node Va at the start time of the writing operation, and disconnects the connection to the memory cell power supply node Va in the subsequent writing operation. The second memory cell power supply voltage generating circuit 112 lowers the potential of the memory cell power supply node Va in the writing operation after the writing operation is started. At the start time of the writing operation, the second memory cell power supply voltage generating circuit 112 may disconnect the connection to the memory cell power supply node Va.

Furthermore, in the memory device of FIG. 1, each of the first and second memory cell power supply voltage generating circuits 111 and 112 has plural resistors for generating the potential based on the resistance division, outputs the potential based on the resistance division to the memory power supply node Va within at least a part of the writing operation time, and disconnects the connection to the memory cell power supply node Va before and after the writing operation.

The plural resistors in the first memory cell power supply voltage generating circuit 111 are plural transistors 122 and 123, and the plural resistors in the second memory cell power supply voltage generating circuit 112 are plural transistors 132 and 133.

The plural transistors 122 and 123 in the first memory cell power supply voltage generating circuit 111 are larger in size than the plural transistors 132 and 133 in the second memory cell power supply voltage generating circuit 112.

In the memory device of FIG. 3, the first memory cell power supply voltage generating circuit 111 has plural resistors for generating the potential based on the resistance division, outputs the potential based on the resistance division to the memory cell power supply node Va in the writing operation, and disconnects the connection to the memory cell power supply node Va before and after the writing operation. The plural resistors in the first memory cell power supply voltage generating circuit 111 are plural transistors 122 and 123. The second memory cell power supply voltage generating circuit 311 has a capacitor C2 for generating the potential based on the capacitance division, outputs the potential based on the capacitance division to the memory cell power supply node Va based on the capacitance division in the writing operation, and disconnects the connection to the memory cell power supply node Va before and after the writing operation.

The memory devices of the first and second embodiments have the memory cell 103 for storing data, the memory cell power supply node Va provided between the memory cell 103 and the power supply line, the first memory cell power supply voltage generating circuit 111 which is coupled to the memory cell power supply node Va and supplies a first potential lower than the potential of the power supply line to the memory cell power supply node Va in at least a part of the writing operation period, and the second memory cell power supply voltage generating circuit 112 or 311 which is coupled to the memory cell power supply node Va and supplies a second potential lower than the potential of the power supply line to the memory cell power supply node Va in at least a part of the writing operation period.

The current supply capacity of the first memory cell power supply voltage generating circuit 111 is higher than the current supply capacity of the second memory cell power supply voltage generating circuit 112 or 311.

A first period for which the first potential is supplied to the memory cell power supply node Va in the writing operation period is shorter than a second period for which the second potential is supplied.

Furthermore, the memory device has a first switch 107 for separating the memory cell power supply node Va from the power supply line for at least a part of the writing operation period.

In the memory device of FIG. 1, the first and second memory cell power supply voltage generating circuits 111 and 112 supply the first potential and the second potential to the memory cell power supply node Va at different timings within the writing operation period.

The first memory cell power supply voltage generating circuit stops the supply of the first potential at a first timing out of the writing operation period, and the second memory cell power supply voltage generating circuit stops the supply of the second potential at a second timing out of the writing operation period which is later than the first timing.

By lowering the potential of the memory cell power supply node in the writing operation, the data can be stably written into the memory cell. If the second memory cell power supply voltage generating circuit lowers the potential of the memory cell power supply node at high speed, the writing time can be shortened, and the writing speed can be increased. Furthermore, if the first memory cell power supply voltage generating circuit keeps the potential of the memory cell power supply node to a low potential separately from the second memory cell power supply voltage generating circuit, the power consumption can be reduced, and the potential of the memory cell power supply node can be prevented from being excessively lowered due to the leak current of the memory cell power supply node.

Aspects of the present invention have now been described in accordance with the above advantages. It will be appreciated that these examples are merely illustrative of the invention. Many variations and modifications will be apparent to those skilled in the art.

What is claimed is:

1. A memory device comprising:
   a power supply line having a potential;
   a memory cell;
   a memory cell power supply node provided between the memory cell and the power supply line;
   a first voltage generating circuit coupled to the memory cell power supply node for supplying the memory cell power supply node with a first potential lower than the potential of the power supply line for a first period corresponding to at least a part of a writing operation period;
   a second voltage generating circuit coupled to the memory cell power supply node for supplying the memory cell power supply node with a second potential lower than the potential of the power supply line for a second period corresponding to at least a part of the writing operation period; and
   a first switch separating the memory cell power supply node from the power supply line for a third period corresponding to at least a part of the writing operation period.

2. The memory device according to claim 1, wherein a first current supply capacity of the first voltage generating circuit is higher than a second current supply capacity of the second voltage generating circuit.

3. The memory device according to claim 1, wherein the first period is shorter than the second period.

4. The memory device according to claim 1, wherein the first voltage generating circuit and the second voltage generating circuit supply the first potential and the second potential, respectively, to the memory cell power supply node at different times within the writing operation period.

5. The memory device according to claim 1, wherein the first voltage generating circuit stops the supply of the first potential at a first time in the writing operation period, and the second voltage generating circuit stops the supply of the second potential at a second time in the writing operation period after the first timing.

6. The memory device according to claim 1, wherein the first voltage generating circuit has a first resistance element group, and the second voltage generating circuit has a second resistance element group.

7. The memory device according to claim 1, wherein the first resistance element group includes a first transistor, and the second resistance element group includes a second transistor.

8. The memory device according to claim 1, wherein the first voltage generating circuit includes a resistance element group, and the second memory cell power supply voltage generating circuit includes a capacitor.

9. The memory device according to claim 1, further comprising:
- a word line coupled to the memory cell;
- a bit line coupled to the memory cell for supplying a writing data to the memory cell; and
- a write amplifier for outputting the writing data to the bit line.

10. The memory device according to claim 9, wherein the memory cell includes a loop circuit having plural inverters.

11. The memory device according to claim 7, wherein the first transistor has a first current driving capacity larger than a second current driving capacity of the second transistor.

12. The memory device according to claim 8, wherein at least one of the plural resistance element groups includes a transistor.

* * * * *